United States Patent
Mercaldi et al.

(10) Patent No.: US 6,833,084 B2
(45) Date of Patent: *Dec. 21, 2004

(54) ETCHING COMPOSITIONS

(75) Inventors: Garry A. Mercaldi, Meridian, ID (US); Donald L. Yates, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/285,773

(22) Filed: Apr. 5, 1999

(65) Prior Publication Data

US 2001/0004553 A1 Jun. 21, 2001

(51) Int. Cl.$^7$ ................................................ C09K 13/00
(52) U.S. Cl. .................... 252/79.1; 252/79.2; 252/79.3; 252/79.4; 438/745; 438/753
(58) Field of Search ............................ 252/79.1, 79.2, 252/79.3, 79.4; 438/745, 753

(56) References Cited

U.S. PATENT DOCUMENTS

| | | | |
|---|---|---|---|
| 3,642,549 A | * 2/1972 | Couture et al. | 438/16 |
| 3,677,848 A | 7/1972 | Stoller et al. | 438/742 |
| 3,767,491 A | * 10/1973 | Chough | 438/746 |
| 4,026,733 A | 5/1977 | Owen, III et al. | 438/301 |
| 4,040,897 A | 8/1977 | Blish, II et al. | 216/97 |
| 4,071,397 A | 1/1978 | Estreicher et al. | 438/753 |
| 4,142,926 A | 3/1979 | Morgan | 438/265 |
| 4,415,383 A | 11/1983 | Naem et al. | 438/301 |
| 4,554,046 A | 11/1985 | Taguchi et al. | 438/746 |
| 4,613,417 A | * 9/1986 | Laskowski et al. | 204/129.85 |
| 4,681,657 A | 7/1987 | Hwang et al. | 438/753 |
| 4,943,618 A | 7/1990 | Stoy et al. | 525/340 |
| 5,013,675 A | 5/1991 | Shen et al. | 438/303 |
| 5,017,513 A | 5/1991 | Takeuchi | 438/688 |
| 5,307,296 A | * 4/1994 | Uchida et al. | 364/578 |
| 5,336,425 A | * 8/1994 | Aoki et al. | 252/100 |
| 5,518,966 A | 5/1996 | Woo | 438/753 |
| 5,532,182 A | 7/1996 | Woo | 438/254 |
| 5,615,613 A | 4/1997 | Hattori et al. | 101/450.1 |
| 5,637,523 A | 6/1997 | Fazan et al. | 438/391 |
| 5,696,384 A | * 12/1997 | Ogi et al. | 252/182.12 |
| 5,714,407 A | * 2/1998 | Maeno et al. | 252/79.1 |

FOREIGN PATENT DOCUMENTS

| | | | |
|---|---|---|---|
| EP | 0905754 A2 | 3/1999 | |
| JP | 51123739 A | * 10/1976 | ........... C09K/13/08 |
| JP | 58207009 | 5/1982 | |

OTHER PUBLICATIONS

Mitsubiahi Electric Corp., Etchant for silicon with minimal undercuting—of aq. hydrogen fluoride and nitric acid, with acid or organic cpd. of viscosity greater than water, English translation of JP 51123739 A Oct. 1976.*

(List continued on next page.)

Primary Examiner—Nadine G. Norton
Assistant Examiner—Lynette T. Umez-Eronini
(74) Attorney, Agent, or Firm—Dickstein Shapiro Morin & Oshinsky LLP

(57) ABSTRACT

The present invention provides an etching composition which includes a polyhydric alcohol in combination with two inorganic acids. Preferably the etching composition of the present invention is a mixture of a glycol, nitric acid and hydrofluoric acid, with propylene glycol being preferred. The etching composition of the present invention achieves a selectivity of greater than 70:1, doped material to undoped material. The present invention provides an etching formulation which has increased selectivity of doped polysilicon to undoped polysilicon and provides an efficient integrated circuit fabrication process without requiring time consuming and costly processing modifications to the etching apparatus or production apparatus.

28 Claims, 3 Drawing Sheets

OTHER PUBLICATIONS

Holoubek J, Bath for etching chromium silicide layer—is for integrated circuit and is mixture of nitric and hydrofluoric acid, diluted by ethylene glycol, Mar. 14, 1990, 1 page. (English title of CS 8801729 A).*

Sapozhniko et al. Determin. of hammer–hardened surface layer thickness—includes treatment with nitric and hydrofluoric acids in glycerine as etching soln. before deformation, 1 page. (English abstract of SU 593110 A).*

Aoki et al., Acidic Liquid Composition and Process for Cleaning Aluminum, Dec. 26, 1991, PCT WO 91/19830, 14 pages.*

Patent Abstracts of Japan, vol. 017, No. 681 (P–1660), Dec. 14, 1993 & JP 05 231996 A (Sumitomo Metal Ind Ltd), Sep. 7, 1993.

Patent Abstracts of Japan, vol. 008, No. 058, (P–261), Mar. 16, 1984 & JP 58 207009 A (Kogyo Gijutsuin; Others: OJ), Dec. 2, 1983.

Baeslack, W. A. III, McQuay, P.A., Lee, D.S., Fletcher, E.D.: "Metallography of Gamma Titanium Aluminides" Materials Characterization, vol. 31, No. 4, Dec. 1993, pp. 197–207, XP000925453, abstract.

Notification of Transmittal of the International Search Repor dated Aug. 1, 2000 with the International Search Report.

* cited by examiner

ETCHING COMPOSITIONS

FIELD OF THE INVENTION

The present invention relates to the field of chemical etching and, in particular, to wet chemical etching of substrates, such as a silicon semiconductor structures, with improved selectivity. The process is particularly adapted for use in producing improved pattern definition in the etching of silicon structures.

BACKGROUND OF THE INVENTION

As the demand for ever-smaller silicon devices continues, and as resolution continues below the sub-micron level, the need for uniform and precise micromachining is increasing. The manufacture of semiconductor integrated circuits typically involves highly complex, time consuming and costly processes which, with continually narrower line width requirements, must be achieved with an ever increasing degree of precision. Within such processes the etching of semiconductor material (e.g., silicon) often entails the use of a chemical bath to which a patterned semiconductor material is exposed, so as to etch selectively certain portions of the surface of a wafer. In a typical chemical etch process, both the rate of etch and the selectivity of etch are parameters critical to the successful formation of an intended substrate geometry.

When the etchant is applied to the semiconductor material (e.g., silicon), the amount of etching performed is dependent upon the etch rate, the length of time the etchant is applied and other physical factors. The direction of the etch is determined by the degree to which the selected etching process is isotropic or anisotropic. Etching which proceeds in all directions at the same rate is said to be "isotropic." By definition, any etching that is not isotropic is anisotropic. The etching of structures from polysilicon requires a process having a high degree of selectivity and anisotropy, without damaging the structure being formed. The problem is exacerbated by the requirements of sub-micron geometries. Wet etching, for example, is isotropic. Many etching processes typically fall between the extremes of being isotropic and completely anisotropic and, therefore, some unwanted etching is common even under the best conditions of prior etching processes.

Another solution is to make an isotropic etchant "selective." An etching process may be made "selective" to one surface over another based upon a variety of characteristics of the material being etched. These characteristics are termed "etch rate varying characteristics" and include, but are not limited to, chemical composition, the ratio of the etchant components, dopant levels, density, post-deposition annealing conditions, deposition temperature and deposition pressure. By making an etching process or etchant "selective" to a particular surface or composition, the process or etchant will etch that particular surface or composition less rapidly than the surrounding surface or other material with which the etchant may come into contact. Accordingly, when an etchant is selective for a heavily doped material such as heavily boron doped BPSG, the etchant will etch layers of material containing heavily boron doped BPSG less quickly than other layers not similarly composed.

Various etching techniques and compositions have been used in the fabrication of semiconductor integrated circuits. For example, U.S. Pat. No. 3,677,848 (Irwin et al.) describes an etching method which immerses a semiconductor body into a mixture of hydrofluoric acid, nitric acid, acetic acid and either sodium chlorite or sodium nitrite. The patent describes that the mixture will etch a silicon or germanium body at a rate of 0.00033 to 0.001 inch/minute. However, the mixture does not have any selectivity to different parts of the silicon or germanium body.

U.S. Pat. No. 4,026,733 (Owen, III et al.) describes a process for defining polycrystalline silicon patterns from a masking member. The patent describes that self-limiting etching of the silicon is achieved through an etchant that discriminates between doped and undoped silicon. The selective etchant solution of the '733 patent includes hydrofluoric acid, nitric acid and acetic acid.

U.S. Pat. No. 4,142,926 (Morgan) describes a process for fabricating a double layer polycrystalline silicon structure for a metal-oxide-semiconductor (MOS) integrated circuit by employing a selective etchant which discriminates between silicon layers. The '926 patent recites that the selective etching solution includes hydrofluoric acid, nitric acid and acetic acid and selectively etches phosphorous doped polycrystalline silicon.

U.S. Pat. No. 4,681,657 (Hwang et al.) describes an etchant composition and method for resistivity specific etching of doped silicon films which overlie intrinsic or lightly doped crystal regions. The etching method includes contacting a semiconductor body with a mixture of hydrofluoric acid, nitric acid and predominantly acetic acid/water mixture.

U.S. Pat. No. 5,532,182 (Woo) describes a process for fabricating stacked DRAM capacitors. The patent describes an etching solution including nitric acid, acetic acid, hydrofluoric acid and deionized water in a ratio of from 30:3:0.5:15 to 30:3:1:15.5 to selectively etched doped silicon.

U.S. Pat. No. 5,637,523 (Fazan et al.) describes a method of forming a capacitor. The patent recites that an etching solution including 0.7% of hydrofluoric acid, 50 to 54% nitric acid and 2.6% acetic acid selectively etched doped polycrystalline silicon. Additionally, the patent describes a selective etching solution including 0.53% HF, 37.63% $HNO_3$, 22.58% $CH_3COOH$ and 4.21% $NH_4F$ with the remainder deionized water achieved a selectivity of greater than 3:1 undoped to doped silicon.

As discussed above, these proposed solutions and additional proposed solutions have been attempted to selectively etch semiconductor materials in the manufacture of integrated circuits with high selectivity. These additional attempts include using anisotropic etchants, tailoring the chemical concentrations of known isotropic etching solutions, and tailoring the physical environments of etching apparatus. However, these prior methods have not provided an etching composition and method having a high selectivity.

SUMMARY OF THE INVENTION

The present invention has advantages over the previous methods in that selectivity of the etching of doped polysilicon is increased with respect to undoped polysilicon. The present invention provides an etching mixture including a polyhydric or lower alkyl alcohol together with a combination of two or more acids. Preferably the etching composition of the present invention is a mixture of a glycol, nitric acid and hydrofluoric acid, with propylene glycol being preferred. By providing an etching formulation which has increased selectivity of doped polysilicon to undoped polysilicon, the present invention provides an efficient integrated circuit fabrication process without requiring time consuming and costly processing modifications to the etching apparatus or production apparatus.

DETAILED DESCRIPTION OF THE PREFERRED EMBODIMENTS

Figure 1:
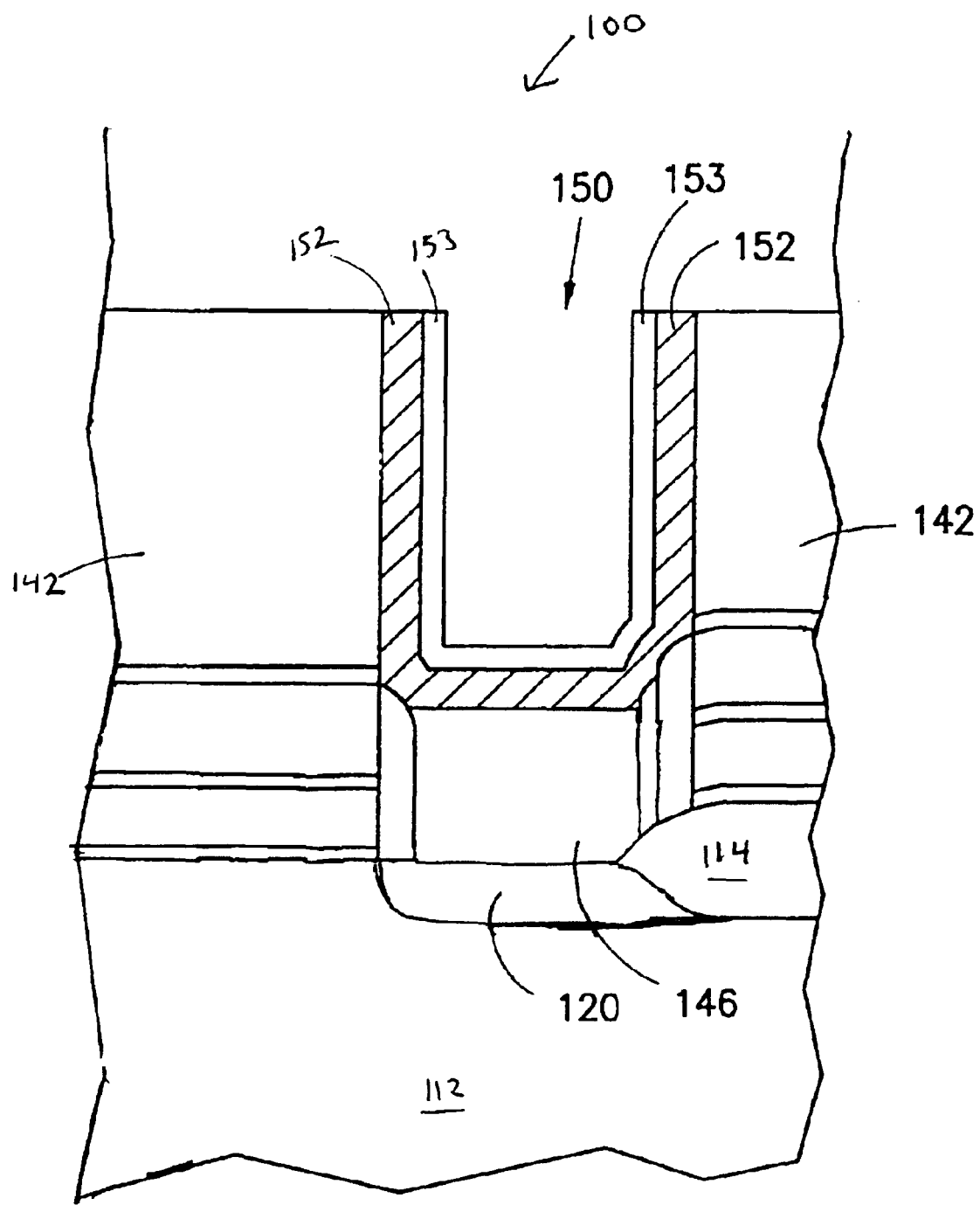
FIG. 1 is a diagrammatic cross-sectional view of a portion of a semiconductor wafer at an intermediate processing step.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The selective etching composition according to the present invention includes an alcoholic component and an acidic component. The selective etching composition optimally includes a polyhydric alcohol or $C_2$–$C_6$ alcohol together with a combination of two or more acids. The selective etching composition of the present invention preferably includes a predominant amount of the alcohol and is also preferably formulated to be a non-aqueous composition, that is a non-water based composition.

The polyhydric alcohols useful in the present invention include any known polyhydric alcohols such as glycerol (also known as glycerin), polyalkylene glycols, and more preferably alkylene polyols and their derivatives, including ethylene glycol, propylene glycol, butylene glycol, dipropylene glycol, polypropylene glycol, polyethylene glycol and derivatives thereof, sorbitol, hydroxypropyl sorbitol, hexylene glycol, 1,3-dibutylene glycol, 1,2,6,-hexanetriol, 1,5-pentanediol, ethoxylated glycerol, propoxylated glycerol and mixtures thereof The $C_2$–$C_6$ alcohols useful in the present invention are those such as ethanol, propanol, isopropanol, iso-butanol, n-butanol and the like as well as mixtures thereof Preferably, the alcoholic component of the selective etching composition is a polyhydric alcohol. A preferred polyhydric alcohol is a glycol, especially those such as ethylene glycol and propylene glycol.

The acidic component of the selective etching composition of the present invention includes two or more inorganic acids. Examples of inorganic acids suitable for the present invention are those such as hydrofluoric acid, nitric acid, phosphoric acid, sulfuric acid, boric acid, carbonic acid, perchloric acid and sulfurous acid. Preferably the acidic component of the selective etching composition includes hydrofluoric acid and nitric acid.

The selective etching composition of the present invention is comprised primarily of the alcoholic component of the composition. In a preferred embodiment of the invention, the ratio of alcohol to nitric acid to hydrofluoric acid ranges from about 10-50:5-40:1, more preferably from about 20-40:10-30:1. In a most preferred embodiment, the selective etching composition according to the present invention is comprised of propylene glycol, nitric acid and hydrofluoric acid in a ratio of about 30:20:1.

The wafers processed according to the present invention were etched by immersing them in a constantly stirred bath of the etchant at a temperature of from about −10° C. to about 70° C., preferably at about 35° C. Stirring of the etching solution can be ultrasonic or by means of a magnetic stirrer. Alternatively, a flow-through agitation or a spray-type etcher could be used.

The selective etching composition of the present invention selectively removes doped materials from the substrate to the exclusion of undoped materials. That is, the selective etching composition of the present invention will rapidly etch materials such as BPSG, doped polysilicon, doped monocrystalline silicon, doped amorphous silicon, doped pseudocrystalline silicon, doped germanium, doped gallium arsenide while not significantly etching undoped materials.

The invention will now be further described with reference to the figures. Reference is now made to FIG. 1. A semiconductor wafer fragment at an intermediate processing step is indicated generally by reference numeral 100. The semiconductor wafer 100 is comprised of a bulk silicon substrate 112 with field isolation oxide regions 114 and doped active area 120 formed therein. A BPSG layer 142 has been deposited on the substrate. A plug 146 of doped polysilicon conductive material has been deposited in plug openings 150. A doped polysilicon conductive layer 152 has been deposited in plug opening 150. An HSG layer 153 has been deposited over the doped polysilicon conductive layer 152 and the portions of the doped polysilicon conductive layer 152 and the HSG layer 153 above the top of the BPSG layer 142 have been removed through CMP. It should be understood, however that the plug 146 and the doped polysilicon conductive layer 152 may also be formed of doped amorphous silicon, monocrystalline silicon and amorphous silicon.

Figure 2:
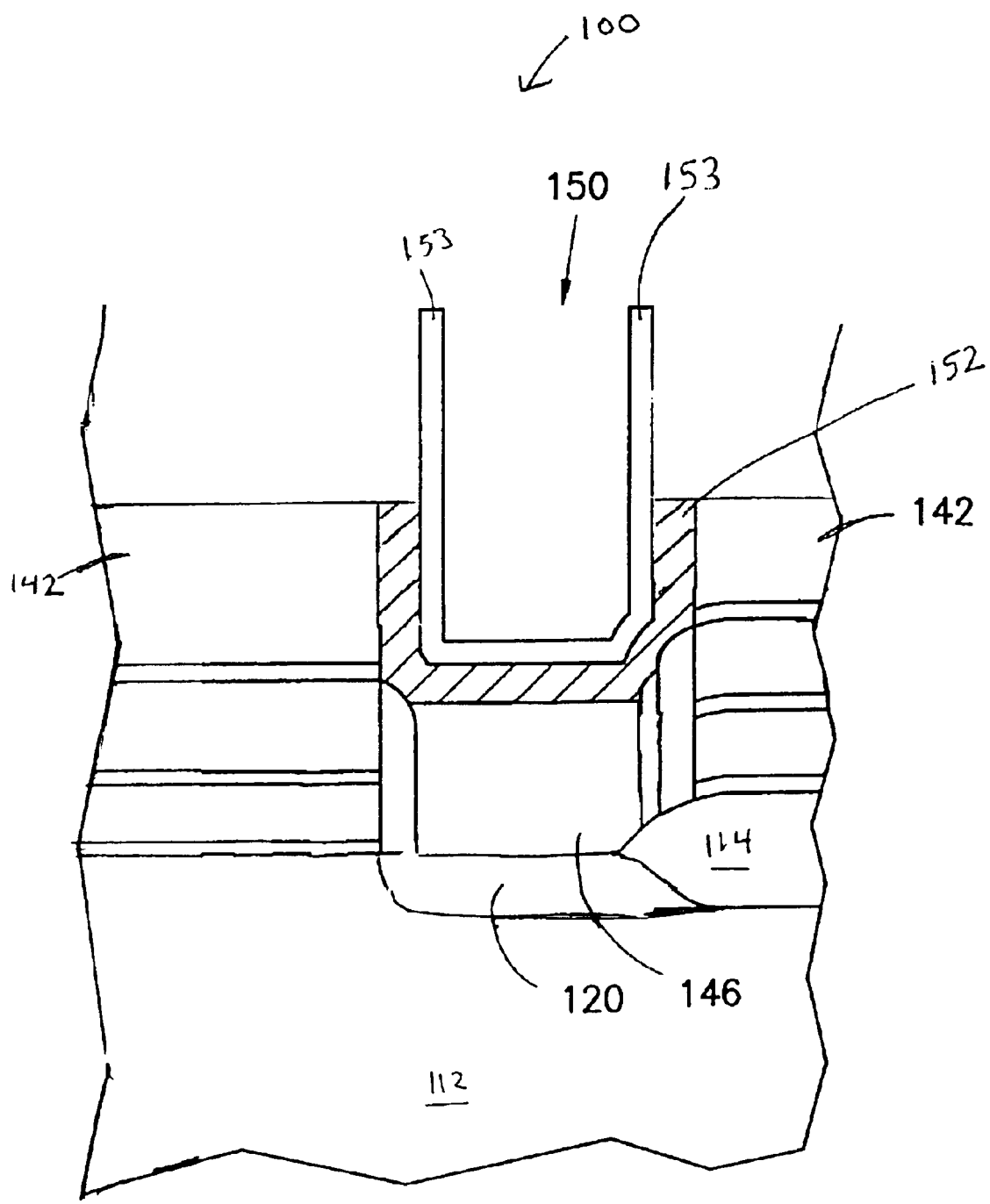
FIG. 2 is a diagrammatic cross-sectional view of a portion of a semiconductor wafer at a processing step subsequent to that shown in FIG. 1.

Referring now to FIG. 2, the BPSG layer 142 and the doped polysilicon conductive layer 152 are then etched back around the HSG layer 153 by immersing the wafer 100 in a etching solution which comprises propylene glycol, nitric acid and hydrofluoric acid in a ratio of 30:20:1 for about 45 seconds in a 35° C. etching bath. The etchant selectively removed the BPSG layer 142 and the doped polysilicon layer 152 as illustrated in the figure, but did not applicably remove the undoped HSG layer 153.

The invention is further explained with reference to the following example. This invention is not intended to be limited by the particular example described below. A polysilicon wafer including in-situ doped polysilicon which has been annealed, undoped polysilicon, thermal silicon oxide and rich BPSG which had been annealed and densified was placed in a static etching bath at 35° C. with a composition of propylene glycol, nitric acid and hydrofluoric acid in a 30:20:1 ratio for a predetermined time. The etching rate of the silicon substrate was measured as shown in Table 1 below.

TABLE 1

| Material Etched | Etch Rate (A/min) |
|---|---|
| Doped Polysilicon | 694.00 |
| Undoped Polysilicon | 9.52 |
| Thermal Silicon Oxide | 49.80 |
| BPSG (annealed and densified) | 1410.67 |

Based on the etching rates of the propylene glycol, nitric acid, hydrofluoric acid etchant measured above, the selectivity ratio of the etchant was measured as a ratio of etching rates as shown in Table 2 below.

TABLE 2

| | Doped Polysilicon | Undoped Polysilicon | Thermal Silicon Oxide | BPSG |
|---|---|---|---|---|
| Doped Polysilicon | — | 73:1 | 14:1 | 1:2 |
| Undoped Polysilicon | — | — | 1:5 | 1:148 |
| Therman Silicon Oxide | — | — | — | 1:28 |
| BPSG | — | — | — | — |

Table 2 shows that the selective etching composition of the present invention achieved a selectivity ratio of greater than 70:1, doped polysilicon to undoped polysilicon, and a selectivity ratio of greater than 140:1, BPSG to undoped polysilicon. These examples show the unexpectedly high selectivity of the composition of the present invention.

Figure 3:
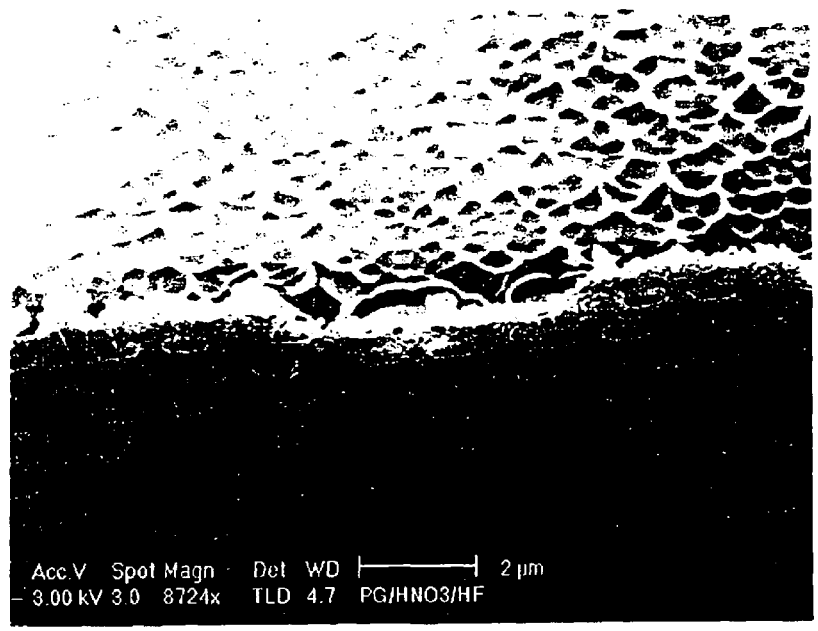
FIG. 3 is a scanning electron microscope (SEM) photograph of a silicon substrate processed according to the present invention.
Figure 4:
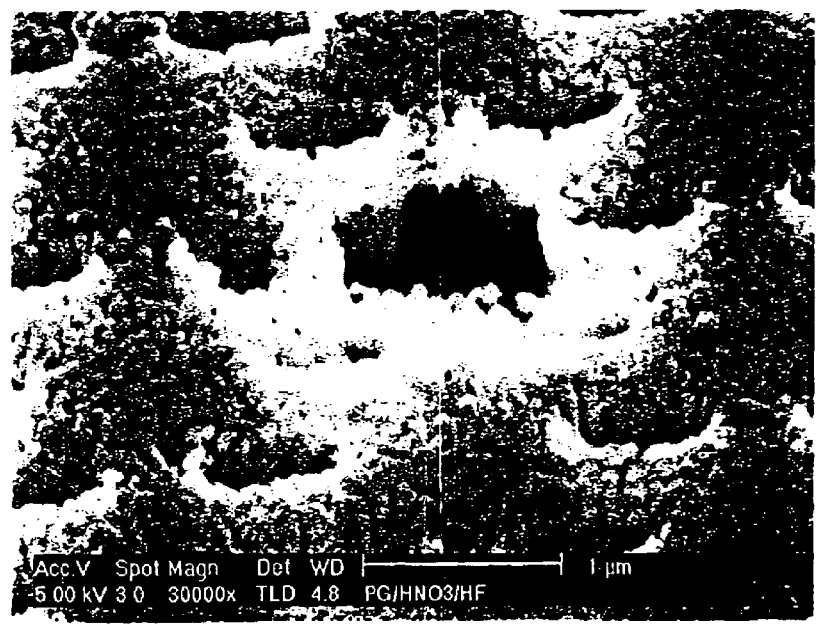
FIG. 4 is a SEM photograph of a silicon substrate processed according to the present invention.

Reference is now made to FIGS. 3–4. These figures show SEM photographs of a silicon wafer in which blanket polysilicon films (030 ISD annealed and 256 undoped) were immersed in a static etching bath at 35° C. with a composition of propylene glycol, nitric acid and hydrofluoric acid in a 30:20:1 ratio for a predetermined time. FIG. 3 is a SEM photograph magnified a 8724 times while FIG. 4 is magnified at 30,000 times. As can be seen from these figures, the complete removal of doped polysilicon is evident. All that remains in the undoped polysilicon showing the high selectivity of the composition of the present invention.

The selective etchant composition according to the present invention can be used in any application requiring the removal of a doped polysilicon layer overlying intrinsic or lightly doped silicon. The intrinsic or lightly doped silicon need not be single crystal silicon, it can be intrinsic or lightly doped polysilicon. The particular composition chosen will be a function of the thickness of the polysilicon to be removed, and will allow a suitable etch rate for process control purposes. The etchant can also be used in applications where the underlying layer is silicon dioxide or silicon nitride or where a silicon dioxide or silicon nitride layer is otherwise exposed to the etchant for limited times.

It should again be noted that although the invention has been described with specific reference to silicon substrates, the invention has broader applicability and may be used in any process where selective etching is required. Similarly, the process described above is but one method of many that could be used. Accordingly, the above description and accompanying drawings are only illustrative of preferred embodiments which can achieve and provide the objects, features and advantages of the present invention. It is not intended that the invention be limited to the embodiments shown and described in detail herein. The invention is only limited by the spirit and scope of the following claims.

What is claimed as new and desired to be protected by Letters Patent of the United States is:

1. An etching composition consisting essentially of:
   a non-aqueous composition of an alcohol and at least two inorganic acids, wherein one of said inorganic acids is selected from the group consisting of sulfuric acid, boric acid, carbonic acid, perchloric acid and sulfurous acid.
2. The composition according to claim 1, wherein said alcohol is propylene glycol.
3. The composition according to claim 1, wherein said alcohol is a $C_2$–$C_6$ alcohol.
4. The composition according to claim 1, wherein the volume ratio of alcohol to a first acid to a second acid is from about 10–50:5–40:1.
5. The composition according to claim 4, wherein the volume ratio of alcohol to said first acid to said second acid is from about 20–40:10–30:1.
6. The composition according to claim 5, wherein the volume ratio of alcohol to said first acid to said second acid is about 30:20:1.
7. An etching composition consisting essentially of:
   a non-aqueous composition of a polyhydric alcohol and at least two inorganic acids, wherein one of said inorganic acids is selected from the group consisting of sulfuric acid, boric acid, carbonic acid, perchloric acid and sulfurous acid.
8. The composition according to claim 7, wherein said polyhydric alcohol is selected from the group consisting of ethylene glycol, propylene glycol, butylene glycol, dipropylene glycol, sorbitol, hexylene glycol, 1,3-dibutylene glycol, 1,2,6,-hexanetriol and 1,5-pentanediol.
9. The composition according to claim 7, wherein said polyhydric alcohol is selected from the group consisting of ethylene glycol and propylene glycol.
10. An etching composition consisting essentially of:
    a non-aqueous composition of an alcohol and at least two inorganic acids, wherein said inorganic acids are selected from the group consisting of nitric acid, phosphoric acid, sulfuric acid, boric acid, carbonic acid, perchloric acid and sulfurous acid.
11. An etching composition consisting essentially of:
    a non-aqueous composition of an alcohol and at least two different inorganic acids selected from the group consisting of phosphoric acid, sulfuric acid, boric acid, carbonic acid, perchloric acid and sulfurous acid.
12. The composition according to claim 11, wherein said alcohol is propylene glycol.
13. The composition according to claim 11, wherein said alcohol is a $C_2$–$C_6$ alcohol.
14. The composition according to claim 11, wherein the volume ratio of alcohol to a first acid to a second acid is from about 10–50:5–40:1.
15. The composition according to claim 14, wherein the volume ratio of alcohol to said first acid to said second acid is from about 20–40:10–30:1.
16. The composition according to claim 15, wherein the volume ratio of alcohol to said first acid to said second acid is about 30:20:1.
17. An etching composition consisting essentially of:
    a non-aqueous composition of a polyhydric alcohol and at least two different inorganic acids selected from the group consisting of phosphoric acid, sulfuric acid, boric acid, carbonic acid, perchloric acid and sulfurous acid.
18. The composition according to claim 17, wherein said polyhydric alcohol is selected from the group consisting of ethylene glycol, propylene glycol, butylene glycol, dipropylene glycol, sorbitol, hexylene glycol, 1,3-dibutylene glycol, 1,2,6,-hexanetriol and 1,5-pentanediol.

19. The composition according to claim 17, wherein said polyhydric alcohol is selected from the group consisting of ethylene glycol and propylene glycol.

20. A composition for etching doped polysilicon from a silicon substrate with high selectivity to undoped polysilicon consisting essentially of:

propylene glycol, nitric acid and hydrofluoric acid in a volume ratio of propylene glycol to nitric acid to hydrofluoric acid from about 10–50:5–40:1.

21. The composition according to claim 20, wherein the volume ratio of propylene glycol to nitric acid to hydrofluoric acid is from about 20–40:10–30:1.

22. The composition according to claim 20, wherein the volume ratio of propylene glycol to nitric acid to hydrofluoric acid is about 30:20:1.

23. An etching composition consisting essentially of:

a non-aqueous composition of propylene glycol and at least two inorganic acids, wherein one of said inorganic acids is selected from the group consisting of hydrofluoric acid, phosphoric acid, sulfuric acid, boric acid, carbonic acid, perchloric acid and sulfurous acid.

24. An etching composition consisting essentially of:

a non-aqueous composition of an alcohol, sulfuric acid, and at least another inorganic acid.

25. An etching composition consisting essentially of:

a non-aqueous composition of an alcohol, boric acid, and at least another inorganic acid.

26. An etching composition consisting essentially of:

a non-aqueous composition of an alcohol, perchloric acid, and at least another inorganic acid.

27. An etching composition consisting essentially of:

a non-aqueous composition of an alcohol, carbonic acid, and at least another inorganic acid.

28. An etching composition consisting essentially of:

a non-aqueous composition of an alcohol, sulfurous acid, and at least one inorganic acid.

* * * * *